United States Patent
Yang et al.

(10) Patent No.: US 12,274,055 B2
(45) Date of Patent: Apr. 8, 2025

(54) CONTROL GATE STRUCTURES IN THREE-DIMENSIONAL MEMORY DEVICES AND METHODS FOR FORMING THE SAME

(71) Applicant: Yangtze Memory Technologies Co., Ltd., Hubei (CN)

(72) Inventors: Yuancheng Yang, Hubei (CN); Lei Liu, Hubei (CN); Wenxi Zhou, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 408 days.

(21) Appl. No.: 17/825,807

(22) Filed: May 26, 2022

(65) Prior Publication Data

US 2022/0406805 A1 Dec. 22, 2022

(30) Foreign Application Priority Data

Jun. 17, 2021 (CN) .......................... 202110669228.X

(51) Int. Cl.
*H10B 41/27* (2023.01)
*H10B 41/30* (2023.01)

(52) U.S. Cl.
CPC .......... *H10B 41/27* (2023.02); *H10B 41/30* (2023.02)

(58) Field of Classification Search
None
See application file for complete search history.

(56) References Cited

U.S. PATENT DOCUMENTS

| | | | |
|---|---|---|---|
| 9,570,463 B1 | 2/2017 | Zhang et al. | |
| 11,968,825 B2 | 4/2024 | Chen et al. | |
| 2015/0129973 A1 | 5/2015 | Ji et al. | |
| 2016/0204122 A1* | 7/2016 | Shoji | H10B 43/50 257/314 |
| 2016/0343728 A1* | 11/2016 | Song | G11C 16/0483 |
| 2018/0097009 A1* | 4/2018 | Zhang | H10B 43/40 |
| 2021/0035988 A1 | 2/2021 | Yoo et al. | |
| 2021/0183882 A1* | 6/2021 | Zhang | H10B 43/40 |

FOREIGN PATENT DOCUMENTS

| | | |
|---|---|---|
| CN | 108093656 A | 5/2018 |
| CN | 110289259 A | 9/2019 |
| CN | 111106122 A | 5/2020 |
| CN | 111162088 A | 5/2020 |

(Continued)

*Primary Examiner* — Nduka E Ojeh
(74) *Attorney, Agent, or Firm* — HANLEY, FLIGHT & ZIMMERMAN, LLC

(57) ABSTRACT

A method includes disposing a layer stack on a substrate, the layer stack including a number of levels. A first control gate structure is formed in a first level of the number of levels by: forming a first opening through a dielectric layer of the first level and a sacrificial layer of the first level; removing a remaining portion of the sacrificial layer of the first level to form a first cavity; and disposing a first conductive layer in the first cavity. A second control gate structure is formed in a second level below the first level by: extending the first opening into a dielectric layer of the second level and a sacrificial layer of the second level to form a second opening; removing a remaining portion of the sacrificial layer of the second level to form a second cavity; and disposing a second conductive layer in the second cavity.

20 Claims, 11 Drawing Sheets

(56) References Cited

FOREIGN PATENT DOCUMENTS

| | | |
|---|---|---|
| CN | 111180446 A | 5/2020 |
| CN | 111211134 A | 5/2020 |
| CN | 111373534 A | 7/2020 |
| EP | 2983196 A1 | 2/2016 |
| KR | 20180000656 A | 1/2018 |

* cited by examiner

CONTROL GATE STRUCTURES IN THREE-DIMENSIONAL MEMORY DEVICES AND METHODS FOR FORMING THE SAME

CROSS-REFERENCE TO RELATED APPLICATIONS

This application claims priority to Chinese Patent Application No. 202110669228X filed on Jun. 17, 2021, which is incorporated herein by reference in its entirety.

TECHNICAL FIELD

This present disclosure generally relates to the field of semiconductor technology, and more particularly, to a method for forming a three-dimensional (3D) memory device.

BACKGROUND

Planar memory cells are scaled to smaller sizes by improving process technology, circuit designs, programming algorithms, and fabrication processes. However, as feature sizes of the memory cells approach a lower limit, planar processes and fabrication techniques have become challenging and costly. As such, memory density for planar memory cells approaches an upper limit. A three-dimensional (3D) memory architecture can address the density limitation in planar memory cells.

BRIEF SUMMARY

Embodiments of a three-dimensional (3D) memory device with control gate structures and methods for forming the same are described in the present disclosure.

In some embodiments, a method for forming a three-dimensional (3D) memory device includes disposing an alternating layer stack on a substrate, wherein the alternating layer stack includes a number of levels. The method includes forming a first control gate structure in a first level of the number of levels. Forming the first control gate can include (i) forming a first opening through a dielectric layer of the first level and a sacrificial layer of the first level; (ii) removing a remaining portion of the sacrificial layer of the first level to form a first cavity; and (iii) disposing a first conductive layer in the first cavity. The method can further include forming a second control gate structure in a second level below the first level. Forming the second control gate structure can include (i)) extending the first opening into a dielectric layer of the second level and a sacrificial layer of the second level to form a second opening; (ii) removing a remaining portion of the sacrificial layer of the second level to form a second cavity; and (iii) disposing a second conductive layer in the second cavity.

In some embodiments, a method for forming a three-dimensional (3D) memory device includes disposing an alternating layer stack on a substrate, the alternating layer stack containing a number of levels. The method can also include forming a channel structure, including (i) forming a channel hole through the alternating layer stack; (ii) disposing a function layer in the channel hole; and (iii) disposing a channel layer in contact with the function layer. The method can also include forming a first control gate structure in a first level of the number of levels. Forming the first control gate structure can include (i) forming a first opening through a dielectric layer of the first level and a sacrificial layer of the first level; (ii) removing a remaining portion of the sacrificial layer of the first level; (iii) removing a first portion of the function layer and exposing a portion of the channel layer; and (iv) disposing a first dielectric material on the exposed portion of the channel layer. The method can also include forming a second control gate structure in a second level below the first level. Forming the second control gate structure can include (i) extending the first opening into a dielectric layer of the second level and a sacrificial layer of the second level to form a second opening; (ii) removing a remaining portion of the sacrificial layer of the second level and exposing a second portion of the function layer; and (iii) disposing a second dielectric material on the exposed second portion of the function layer.

In some embodiments, a three-dimensional (3D) memory device includes an alternating layer stack disposed on a substrate, the alternating layer stack containing a number of levels. The 3D memory device can include a first control gate structure disposed in a first level of the number of levels, the first control gate structure containing a first dielectric layer and a first conductive layer in contact with the first dielectric layer. The 3D memory device can also include a second control gate structure disposed in a second level below the first level, the second control gate structure containing a second dielectric layer and a second conductive layer in contact with the second dielectric layer, wherein material compositions or thicknesses of the first and second conductive layers are different.

In some embodiments, a method for forming three-dimensional memory devices includes forming an alternating stack of layers on a substrate, the alternating stack of layers includes N number of levels. Each level of the alternating stack of layers include a pair of a dielectric layer and a sacrificial layer. The method can include forming, on a side of the alternating stack of layers that is opposite to the substrate, N number of control gate structures. Forming each control gate structure can include replacing a sacrificial layer of a level before forming an underlying control gate structure. The material composition and/or structures of the control gate structure can be different among the N number of control gate structures.

In some embodiments, the method can also include forming an $M^{th}$ opening extending through the $M^{th}$ level of the alternating stack of layers, removing the sacrificial layers through the opening, and forming the $M^{th}$ control gate, wherein $1 \leq M \leq N$.

In some embodiments, the method can also include sequentially forming, on the inner sidewall surfaces of the $M^{th}$ opening, the $M^{th}$ control gate, including: a dielectric layer, a first conductive layer, and a second conductive layer.

In some embodiments, the method can also include forming N number of control gate structures with different structure or material composition by adjusting at least one of a thickness of the dielectric layer, a material composition of the dielectric layer, a thickness of the first conductive layer, and an interface dipole moment between the first conductive layer and the dielectric layer.

In some embodiments, the dielectric layer can include aluminum oxide and the first conductive layer includes titanium aluminum nitride.

In some embodiments, the method can also include forming a channel structure extending through the alternating stack layer stack. A control gate structure and another control gate structure of the N number of control gate structures can be formed with different structure or material composition.

In some embodiments, forming the channel structure can include forming a channel hole extending through the alternating layer stack and sequentially forming a function layer and a channel layer on the inner surface of the channel hole.

In some embodiments, the method can also include removing a portion of a sacrificial layer of the $M^{th}$ level and expose a portion of the channel layer, wherein M equals to 1 or N.

In some embodiments, the method can further include disposing a conductive material to form a control gate structure.

In some embodiments, a three-dimensional memory device can include a substrate and an alternating layer structure formed on the substrate. The alternating layer structure includes N levels of memory units, each memory unit includes a pair of layers containing of dielectric layer and a control gate structure. Each control gate structure of the N levels of memory units can be formed with different material composition and/or thicknesses, and N is greater than 2.

In some embodiments, the three-dimensional memory device can also include a channel structure extending through the alternating layer stack.

In some embodiments, the control gate structure can include a first conductive layer, a dielectric layer, and a second conductive layer. The first conductive layer and the dielectric layer at least partially surround the second conductive layer. The dielectric layer includes aluminum oxide and the first conductive layer includes titanium aluminum nitride.

In some embodiments, at least one of the following characteristics of a control gate structure is different from a characteristic of another control gate structures: a thickness of the dielectric layer, a material composition of the dielectric layer, a thickness of the first conductive layer, and an interface dipole moment between the first conductive layer and the dielectric layer.

In some embodiments, the channel structure can include a channel layer and a function layer at least partially surrounding the channel layer.

In some embodiments, N levels of memory units can be arranged sequentially on the substrate. The first level and the $N^{th}$ level of memory units extend through the function layer. N is greater than or equal to 3.

In some embodiments, the control gate structure can be separated from the channel layer.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
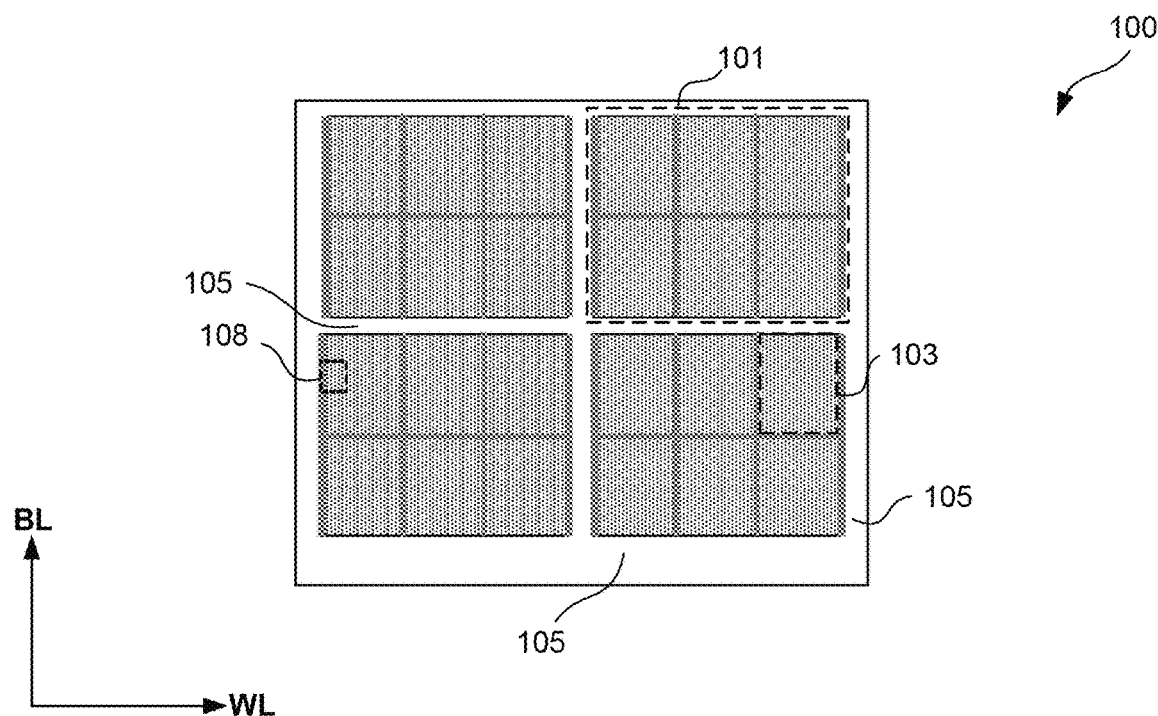
FIG. 1A illustrates a schematic top-down view of an exemplary three-dimensional (3D) memory chip, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

As the development of 3D memory (e.g., 3D NAND flash memory) progress towards high density and high capacity memory cells, the number of staircase layers in 3D memory devices continues to increase. The threshold voltage of each memory cell is closely related to the physical structure of the memory cell. As the number of staircase layers increase, fabrication condition variations can cause differences in critical dimensions of different portions of a channel structure, which in turn can lead to deviations from threshold voltages for memory cells formed within the same channel structure. The deviations can cause errors in memory cell operation and reduce device yield.

Various embodiments in accordance with the present disclosure provide structures and fabricating methods for forming alternating control gate structures in 3D memory devices. For example, alternating layer stack of dielectric layers and sacrificial layers are formed on a substrate, followed by replacing the sacrificial layers with control gate structures in a top-down sequence. Specifically, the replacement process can begin from the sacrificial layers of upper levels of the alternating layer stack and continues to replace the underlying one or more sacrificial layers at a time. An opening can partially extend through the alternating layer stack of dielectric layers and sacrificial layers, exposing the sidewalls of one or more sacrificial layers. Each exposed sacrificial layers can be replaced by a control gate structures. After the exposed sacrificial layers are replaced, the opening extends further down towards the substrate and exposes another set of one or more sacrificial layers. Each sacrificial layer of the newly exposed set of one or more sacrificial layers is replaced by another control gate structures. In some embodiments, the control gate structures formed in each replacement step can be different, allowing variations in control gate structures (e.g., layer material and/or layer thickness) such that the threshold voltages of memory cells throughout each channel structure are substantially the same. The replacement process can continue until all sacrificial layers are replaced.

FIG. 1A illustrates a top-down view of an exemplary 3D memory device 100, according to some embodiments of the present disclosure. 3D memory device 100 can be a memory chip (package), a memory chip or any portion of a memory chip, and can include one or more memory planes 101, each of which can include a plurality of memory blocks 103. Identical and concurrent operations can take place at each memory plane 101. Memory block 103, which can be megabytes (MB) in size, can be the smallest size to carry out erase operations. Shown in FIG. 1A, exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIGS. 1A and 1B. In this disclosure, memory block 103 is also referred to as a "memory array" or "array." The memory array is the core area in a memory device, performing storage functions.

3D memory device 100 can include a periphery region 105, an area surrounding memory planes 101. Periphery region 105 can contain many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

The arrangement of memory planes 101 in 3D memory device 100 and the arrangement of memory blocks 103 in each memory plane 101 illustrated in FIG. 1A are only provided as an example, which does not limit the scope of the present disclosure.

Figure 1B:
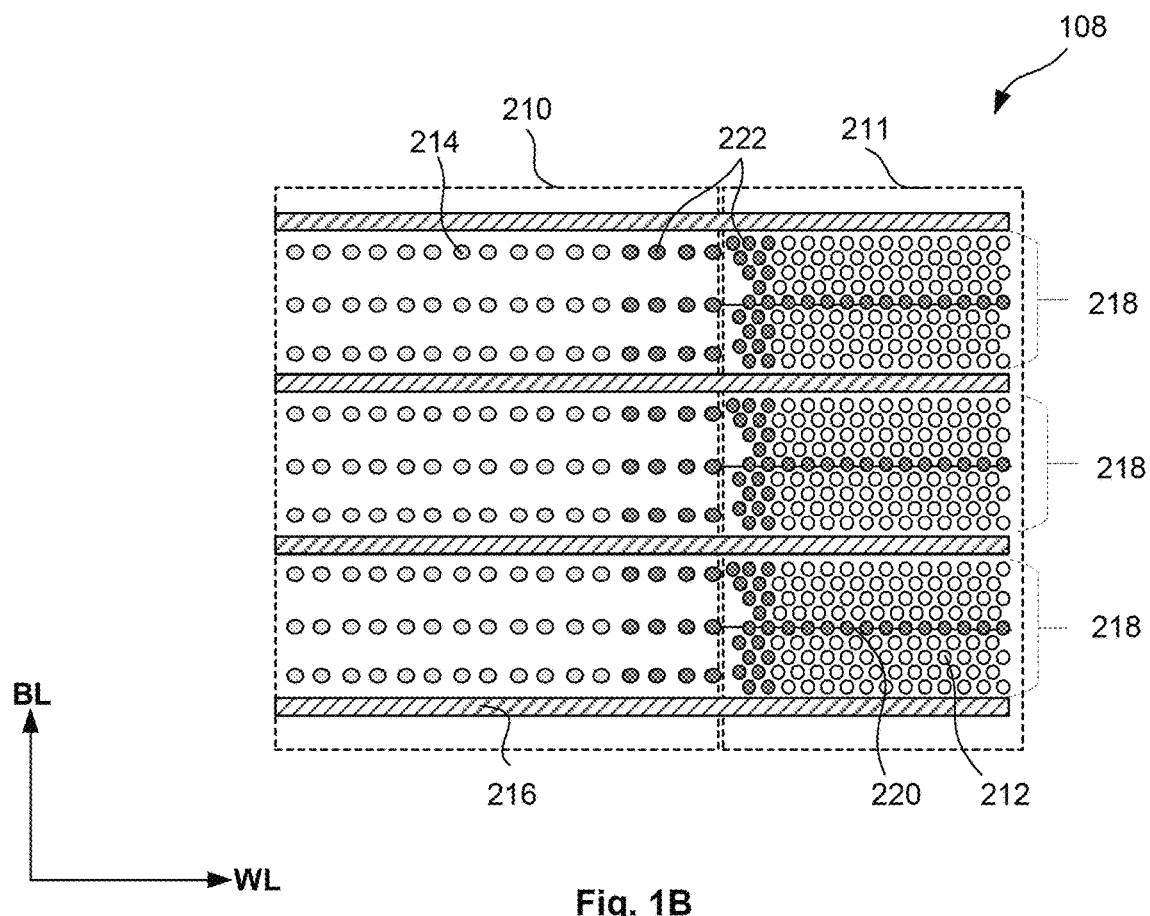
FIG. 1B illustrates a schematic top-down view of a region of a 3D memory chip, according to some embodiments of the present disclosure.

Referring to FIG. 1B, an enlarged top-down view of a region 108 in FIG. 1A is illustrated, according to some embodiments of the present disclosure. Region 108 of 3D memory device 100 can include a staircase region 210 and a channel structure region 211. Channel structure region 211 can include an array of memory strings 212, each including a plurality of stacked memory cells. Staircase region 210 can include a staircase structure and an array of contact structures 214 formed on the staircase structure. In some embodiments, a plurality of slit structures 216, extending in WL direction across channel structure region 211 and staircase region 210, can divide a memory block into multiple memory fingers 218. At least some slit structures 216 can function as the common source contact for an array of memory strings 212 in channel structure regions 211. A top select gate cut 220 can be disposed in the middle of each memory finger 218 to divide a top select gate (TSG) of memory finger 218 into two portions, and thereby can divide a memory finger into two programmable (read/write) pages. While erase operation of a 3D NAND memory can be carried out at memory block level, read and write operations can be carried out at memory page level. A page can be kilobytes (KB) in size. In some embodiments, region 108 can include dummy memory strings for process variation control during fabrication and/or for additional mechanical support.

Figure 1C:
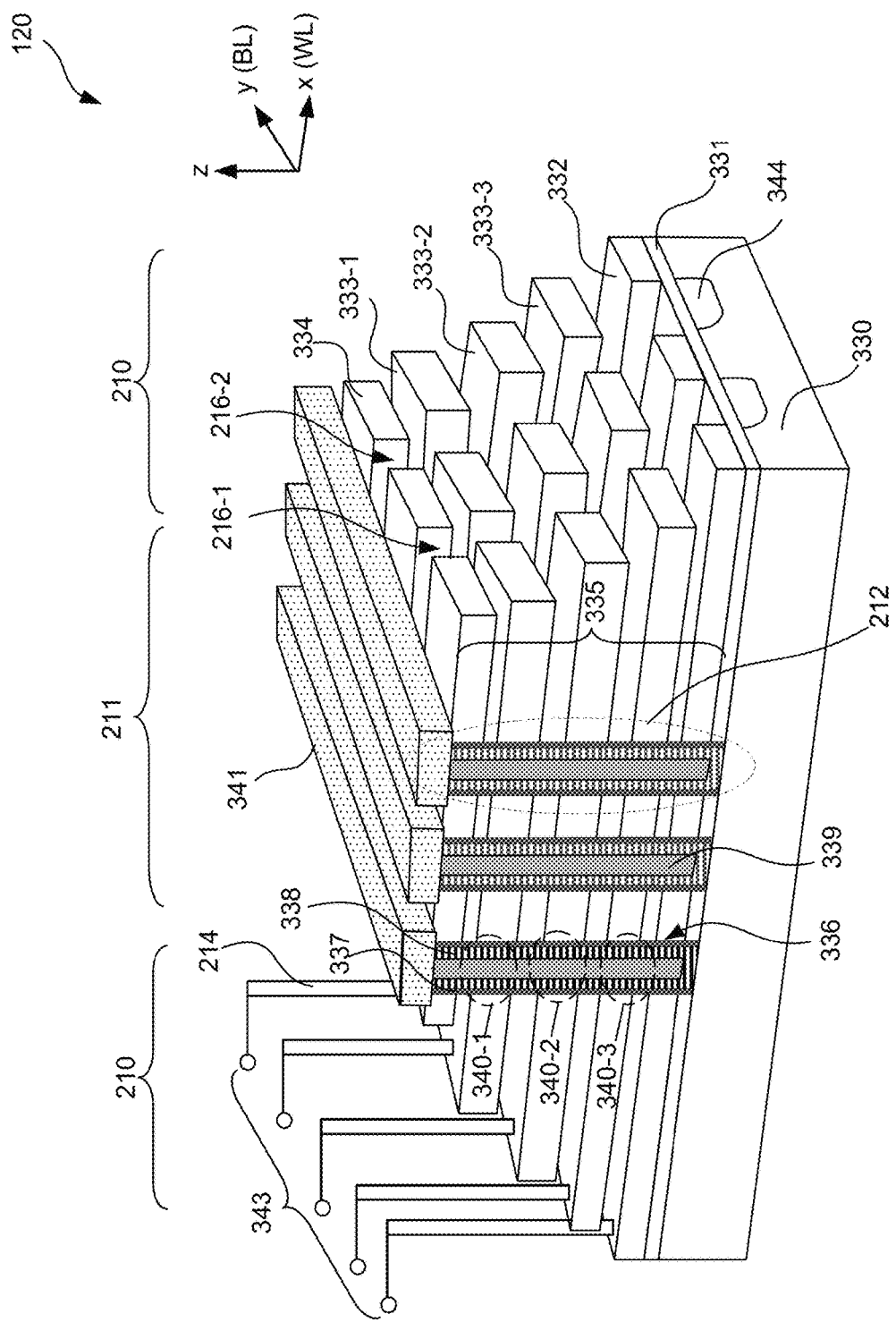
FIG. 1C illustrates a prospective view of a portion of an exemplary 3D memory array structure, according to some embodiments of the present disclosure.

FIG. 1C illustrates a perspective view of a portion of an exemplary 3D memory array structure 120, according to some embodiments of the present disclosure. Memory array structure 120 includes a substrate 330, an insulating film 331 over the substrate 330, a tier of bottom select gates (BSGs) 332 over the insulating film 331, and a plurality of tiers of control gates 333, also referred to as "word lines (WLs)," stacking on top of the BSGs 332 to form a film stack 335 of alternating conductive and dielectric layers. The dielectric layers adjacent to the tiers of control gates are not shown in FIG. 1C for clarity.

The control gates of each tier are separated by slit structures 216-1 and 216-2 through the film stack 335. Memory array structure 120 can include a tier of top select gates (TSGs) 334 over the stack of control gates 333. The stack of TSG 334, control gates 333 and BSG 332 are also referred to as "gate structures." Memory array structure 120 further includes memory strings 212 and doped source line regions 344 in portions of substrate 330 between adjacent BSGs 332. Each memory strings 212 includes a channel hole 336 extending through insulating film 331 and film stack 335 of alternating conductive and dielectric layers. Memory strings 212 can also include a memory film 337 on a sidewall of the channel hole 336, a channel layer 338 over the memory film 337, and a core filling film 339 surrounded by the channel layer 338. A memory cell 340 can be formed at the intersection of control gate 333 and memory string 212. Memory array structure 120 further includes a plurality of bit lines (BLs) 341 connected with memory strings 212 over TSGs 334. Memory array structure 120 can include a plurality of metal interconnect lines 343 connected with the gate structures through a plurality of contact structures 214. The edge of film stack 335 is configured in a shape of staircase to allow an electrical connection to each tier of the gate structures.

In FIG. 1C, for illustrative purposes, three tiers of control gates 333-1, 333-2, and 333-3 are shown together with one tier of TSG 334 and one tier of BSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. Memory array structure 120 can also include other structures, for example, TSG cut, common source contact and dummy channel structure. These structures are not shown in FIG. 1C for simplicity.

To achieve higher storage density, the number of vertical WL stacks of a 3D memory or the number of memory cells per memory string has been greatly increased, for example, from 64 stacked WL layers to 128 layers or more. Further increasing the number of vertical WL stacks brings challenges for forming channel structures that extend through the vertical WL stacks. For example, channel openings having high aspect ratios (e.g., ratio of height over width) can lead to over-etching of the upper portion of the openings and under-etching of the lower portions of the opening. The non-uniform etching can lead to cross-talk or undesirable coupling between adjacent memory cells, such as memory cells 340-1, 340-2, and 340-3 illustrated in FIG. 1C.

Figure 2:
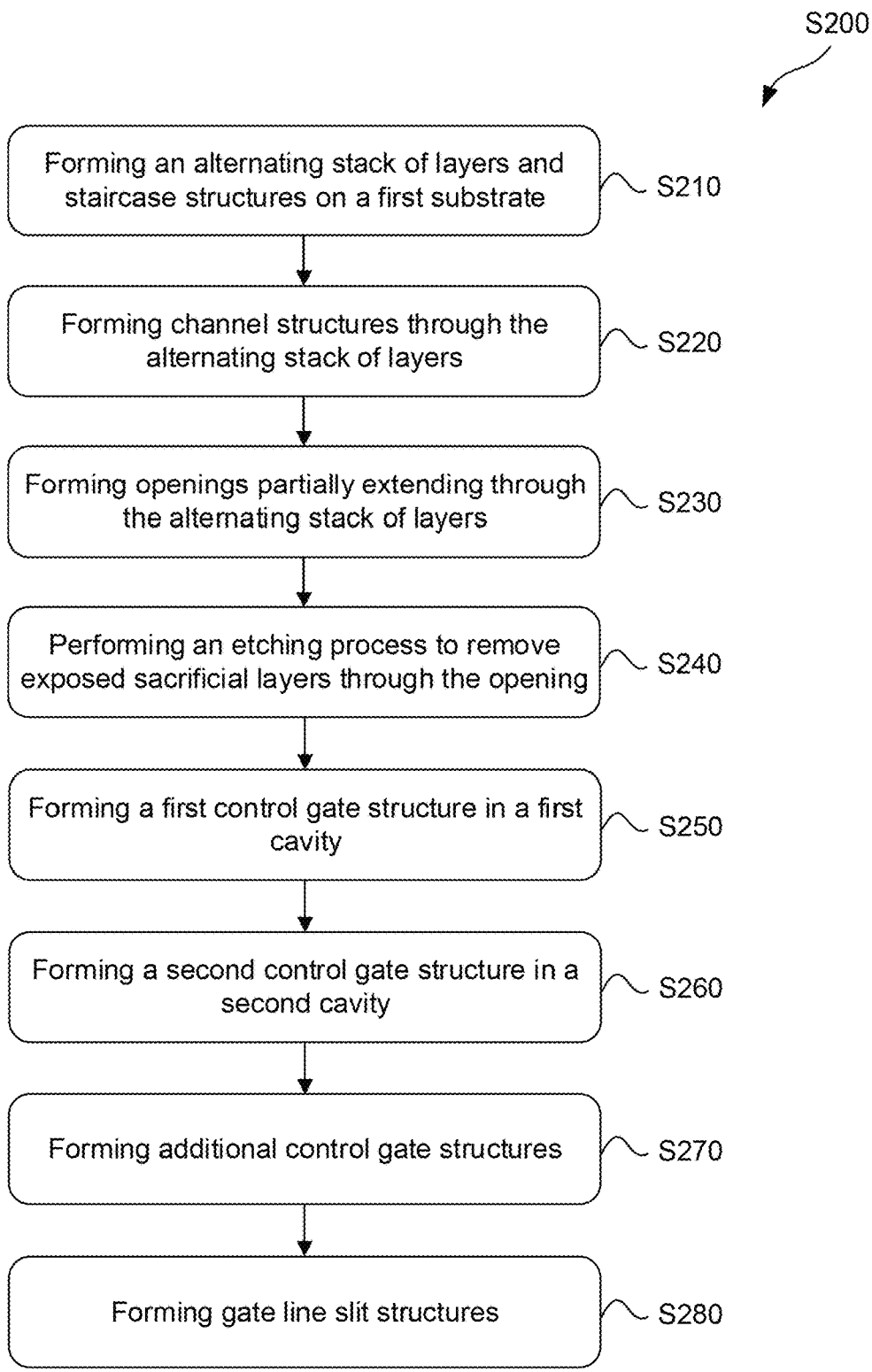
FIG. 2 illustrates a flow diagram of forming control gate structures in a 3D memory device, according to some embodiments of the present disclosure.

FIG. 2 is a flow diagram of an exemplary method S200 for forming alternating control gate structures in 3D memory devices, in accordance with some embodiments of the present disclosure. The operations of method S200 can be performed in a different order and/or vary, and method S200 can include more operations that are not described for simplicity. FIGS. 3A-3H are cross-sectional views of 3D memory device 300 during various fabrication steps for forming alternating control gate structures. The fabrication processes provided here are exemplary, and alternative processes in accordance with this disclosure can be performed that are not shown in these figures.

Figure 3A:
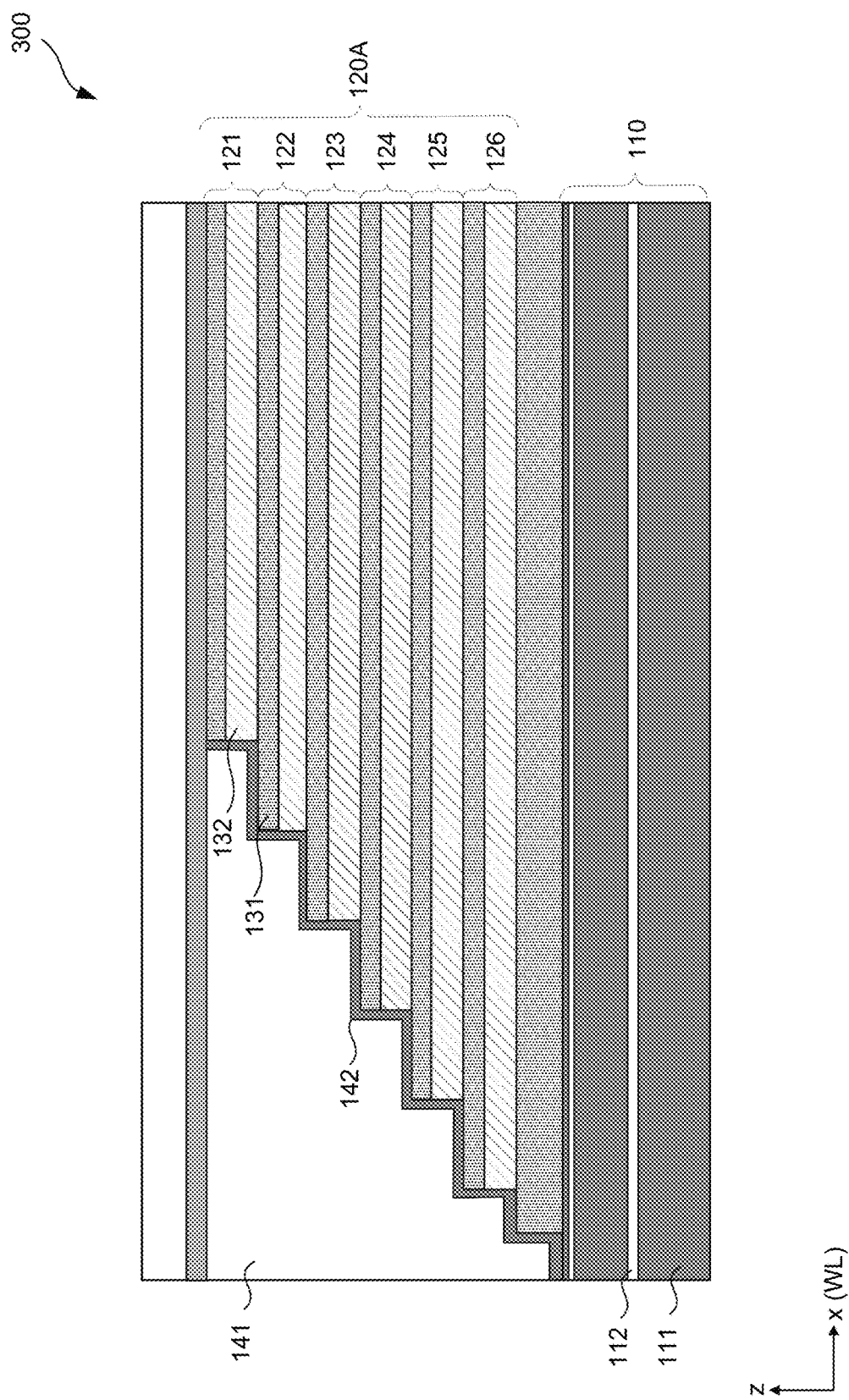
FIGS. 3A-3H illustrate schematic cross-sectional views of various fabrication stages of a 3D memory device, according to some embodiments of the present disclosure.

Referring to FIG. 2, at operation S210, an alternating stack of layers and staircase structures are formed on a substrate, according to some embodiments. As shown in FIG. 3A, an alternating layer stack 120A can be disposed on a substrate 110, according to some embodiments. In some embodiments, a dielectric layer 131 and a sacrificial layer 132 can be alternatingly disposed on the substrate.

Substrate 110 can include silicon (e.g., single crystalline silicon), silicon germanium (SiGe), germanium (Ge), silicon on insulator (SOI), germanium on insulator (GOI), gallium arsenide (GaAs), gallium nitride, silicon carbide, glass, III-V compound, any other suitable materials or any combinations thereof. In some embodiments, substrate 110 can be double-side polished prior to device fabrication. Substrate 110 can be a multi-layer structure including one or more suitable sub-layers. For example, substrate 110 can include base 111 formed using silicon and an oxide layer 112 formed of silicon oxide.

Alternating layer stack 120A can include dielectric layers 131 and sacrificial layers 132. In some embodiments, dielectric layers 131 can be formed using a silicon oxide material. In some embodiments, sacrificial layers 132 can be formed using a silicon nitride material. Dielectric layers 131 and sacrificial layers 132 can be disposed using one or more thin-film deposition processes including, but not limited to, chemical vapor deposition (CVD), plasma-enhanced CVD (PECVD), physical vapor deposition (PVD), atomic layer deposition (ALD), plasma-enhanced ALD (PEALD), or any combinations thereof. In some embodiments, thicknesses of dielectric layers 131 can be the same or different. Similarly, thicknesses of sacrificial layers 132 can be the same or different.

Alternating layer stack 120A can be processed to form staircase structures, according to some embodiments. The staircase structures can be formed using a "trim-etch" multi-cycle process. Specifically, a masking layer (e.g., photoresist layer) can be disposed on alternating layer stack 120A and patterned using suitable photolithography process. The "trim-etch" multi-cycle process can form multiple staircase divisions in alternating layer stack 120A and can also form steps of staircase structures with different depths. The "trim-etch" multi-cycle process can include trimming the masking layer in a first direction (e.g., y direction) and etching a part of alternating layer stack 120A uncovered by the masking layer. The part of alternating layer stack 120A uncovered by the masking layer can be etched by a stair depth. The masking layer can be trimmed to further expose portions of alternating layer stack 120A. The cycles of trimming and etching can be repeated for a number of times based on the number of staircase divisions. In some embodiments, the masking layer is trimmed in the first direction and also in a second direction perpendicular to the first direction. After the staircase is formed, each pair of dielectric layer 131 and sacrificial layer 132 can be considered as a level (e.g., a step) of the staircase structure. In some embodiments, alternating layer stack 120A can include any suitable amount of levels, such as 32 levels, 64 levels, 128 levels, etc. FIGS. 3A-3H illustrate six levels (e.g., levels 121-126) of the staircase structure and other levels are omitted for simplicity.

Insulating layer 141 can be formed on the staircase structure of alternating layer stack 120A. In some embodiments, insulating layer 141 can be formed of a dielectric material similar to that of dielectric layer 131. For example, insulating layer 141 can be formed of silicon oxide. Insulating layer 141 can be formed using suitable deposition methods, such as CVD, PVD, PECVD, ALD, any suitable deposition methods, or any combinations thereof. In some embodiments, a chemical mechanical polishing (CMP) process can be used to remove portions of insulating layer 141 formed on the top-most level 121 such that top surfaces of insulating layer 141 and alternating layer stack 120A can be substantially co-planar. In some embodiments, an optional protective layer 142 can be formed on the staircase structure of alternating layer stack 120A prior to the deposition of insulating layer 141. In some embodiments, protective layer 142 can be formed using a material that is different from sacrificial layer 132, such as silicon oxide or aluminum oxide.

Figure 3B:
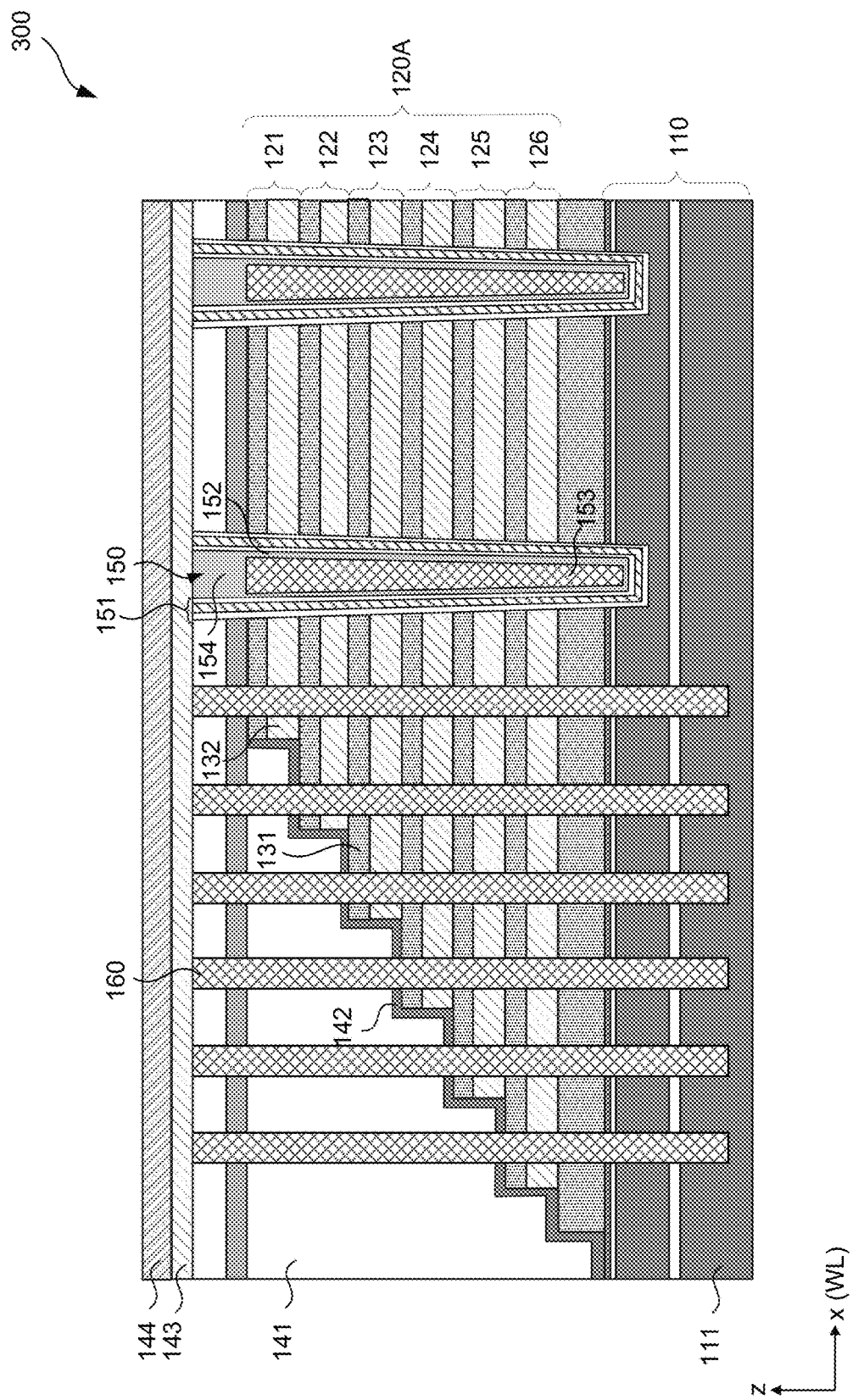

Referring to FIG. 2, at operation S220, channel structures are formed through the alternating stack of layers, according to some embodiments. As shown in FIG. 3B, channel structures 150 can extend through alternating layer stack 120A and into substrate 110. In some embodiments, channel structures 150 can include a function layer 151 containing a tunneling layer, a charge storage layer, and a blocking layer, arranged along a horizontal direction (e.g., x direction) from the center of each channel structure 150 outward, according to some embodiments. Channel structures 150 also include a channel layer 152 and a core filling layer 153. Channel layer 152 is at least partially surrounded by function layer 151. In some embodiments, core filling layer 153 can be formed using an insulating material such as silicon oxide and disposed using CVD, PVD, ALD, or any suitable deposition methods. In some embodiments, channel layer 152 and core filling film 153 can be respectively similar to channel layer 338 and core filling film 339 of FIG. 1C and are not described in detail herein for simplicity. In some embodiments, air gaps (not illustrated in FIG. 3B) can be embedded in core filling layer 153 to reduce stress within channel structures 150. In some embodiments, core filling film 153 can be etched back and a channel plug 154 can be formed. In some embodiments, channel plug 154 can be formed using similar material as channel layer 152, such as a polysilicon material.

Dummy channel structures 160 can also be formed through alternating layer stack 120A. In some embodiments, structures and compositions of dummy channel structures 160 can be similar to channel structures 150, except that top portions of dummy channel structures 160 may not contain channel contact structures for connecting to conductive lines. In some embodiments, dummy channel structures can be filled with insulating materials. Dummy channel structures 160 can be formed using CVD, PVD, ALD, suitable deposition methods, or combinations thereof.

Capping layer 143 can be formed on top surfaces of channel structures 150 and dummy channel structures 160. In some embodiments, capping layer 143 can be formed using an insulating material similar to that of insulating layer 141, such as silicon oxide. In some embodiments, a CMP process can be performed such that the top surface of capping layer 143 is substantially planar.

Masking layer 144 can be disposed on a top surface of capping layer 143. In some embodiments, masking layer 144 can be formed using silicon oxide, silicon nitride, silicon carbon nitride, any suitable masking material, or combinations thereof. In some embodiments, masking layer 144 can be formed using a photoresist material. In some embodiments, masking layer 144 can be patterned and used as an etching mask for subsequent fabrication processes.

Figure 3C:
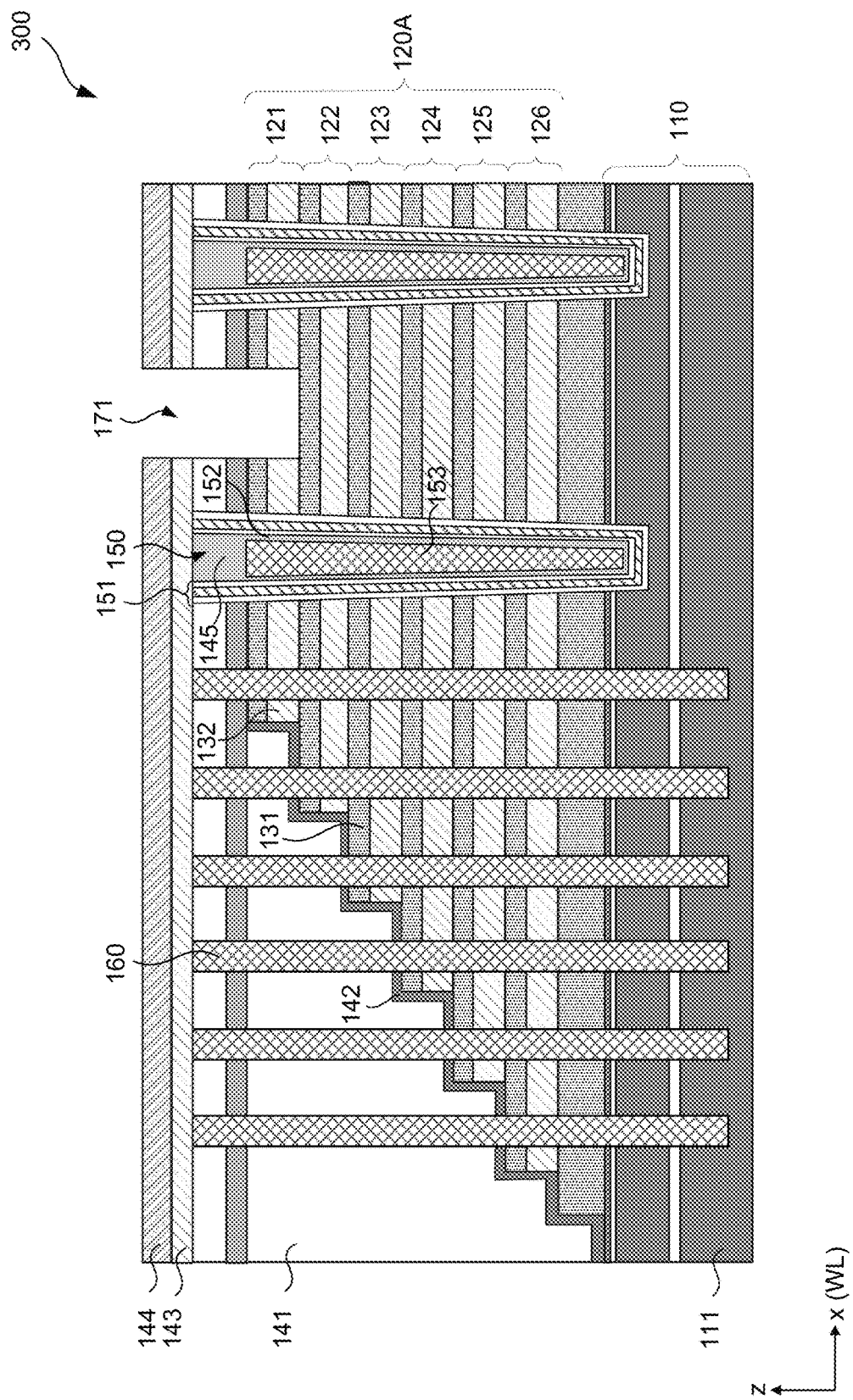
Figure 3D:
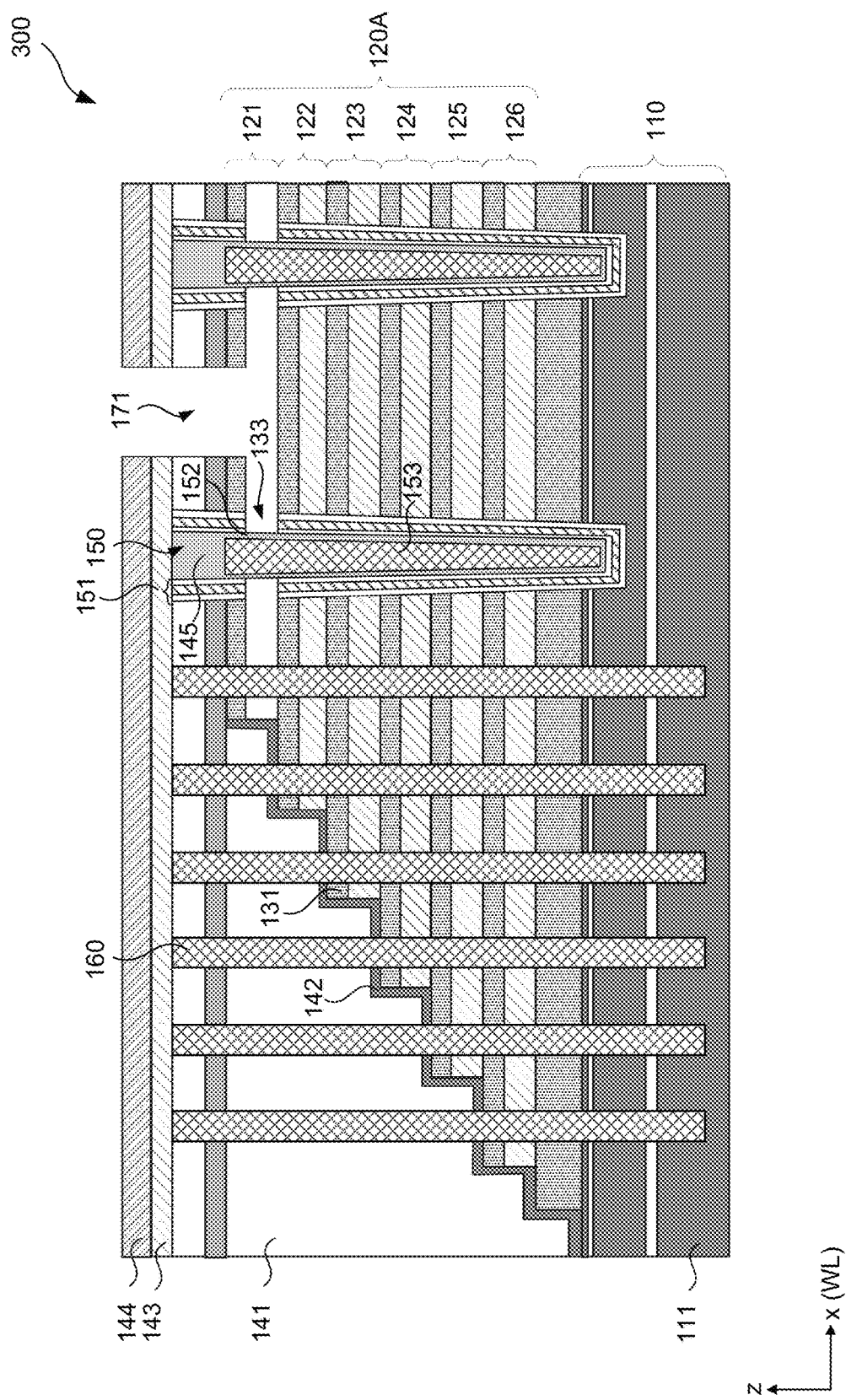

Referring to FIG. 2, at operation S230, openings are formed partially extending through the alternating stacks of layers, according to some embodiments. As shown in FIG. 3C, an opening 171 can extend through masking layer 144 and capping layer 143 and through one or more levels of alternating layer stack 120A. For example, FIG. 3C illustrates that opening 171 extending through sacrificial layer 132 of the top-most level 121 of alternating layer stack 120A. Opening 171 exposes sidewalls of sacrificial layer 132 of level 121. In some embodiments, opening 171 can be formed using one or more etching processes, including plasma dry etch, wet chemical etch, or combinations thereof. The one or more etching processes can incorporate chemical etchants suitable for removing materials such as silicon oxide and silicon nitride for removing portions of dielectric layer 131 and sacrificial layer 132. FIG. 3C illustrates that opening 171 extend into the top-most level 121 of alternating layer stack 120A and exposing a portion of dielectric layer 131 of level 122. In some embodiments, the etching processes for forming opening 171 can extend through two or more levels of alternating layer stack 120A, such as underlying levels 122 and 123 during operation S230.

Referring to FIG. 2, at operation S240, an etching process is performed to remove exposed sacrificial layers through the opening, according to some embodiments. An etching process begins from sidewalls of sacrificial layer 132 of level 121 that is exposed through opening 171 and continues until sacrificial layer 132 of level 121 is removed. A first cavity 133 is formed in place of sacrificial layer 132 after the latter is removed. In some embodiments, a wet chemical etching process suitable for removing silicon oxide material is used to remove sacrificial layer 132. In some embodiments, function layer 151 can also be removed during the etching process exposing sidewalls of channel layer 152. Therefore, after the etching process, portions of channel layer 152 and protective layer 142 is exposed in cavity 133. In some embodiments, first cavity 133 also exposes insulating layer 141 in a configuration where protective layer 142 is optional.

Figure 3E:
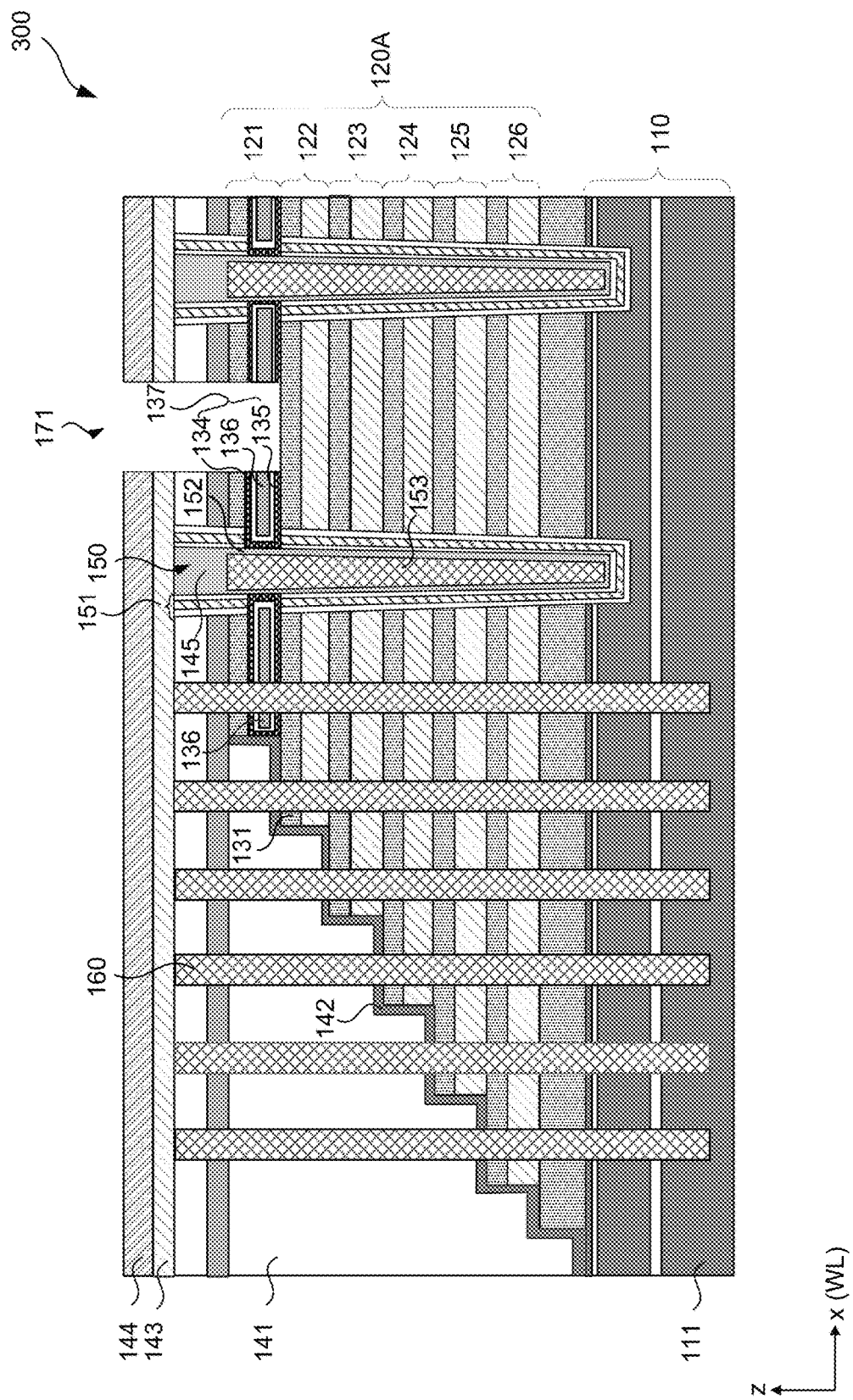

Referring to FIG. 2, at operation S250, a first control gate structure is formed in the first cavity, according to some embodiments. As shown in FIG. 3E, a first control gate structure 137 includes a dielectric layer 134, a first conductive layer 135, and a second conductive layer 136, sequentially deposited in first cavity 133. As function layer 151 (containing a charge storage layer) is removed from first cavity 133 in level 121 described in FIG. 3D, no memory cells are formed in level 121. As such, first control gate structure 137 can be referred to as a top select gate (TSG). Incorporating a dummy control gate in the memory device can provide various benefits. For example, when first control gate structure 137 is voltage-biased to switch the selection transistor between ON/OFF states, the threshold voltage of the selection transistor remains substantially the same due to an absence of trapped charges in a charge storage layer.

First control gate structure 137 can be formed using suitable dielectric and conductive materials. For example, dielectric layer 134 can be formed using aluminum oxide, hafnium oxide, any suitable oxide material, or combinations thereof. First conductive layer 135 can be formed using titanium aluminum nitride, titanium nitride, any suitable conductive nitride material, or combinations thereof. Second conductive layer 136 can be formed using tungsten, cobalt, copper, aluminum, doped crystalline silicon, any suitable conductive material, or combinations thereof. In some embodiments, dielectric layer 134, first conductive layer 135, and second conductive layer 136 can be formed using CVD, PVD, PECVD, ALD, any suitable deposition processes, or combinations thereof. Excessive dielectric materials or conductive materials formed on sidewalls of opening 171 can be removed after first control gate structure 137 is formed in first cavity 133. Additional masking material similar to that of masking layer 144 can be deposited on sidewalls of openings 171 to protect first control gate structure 137 from subsequent fabrication processes.

Figure 3F:
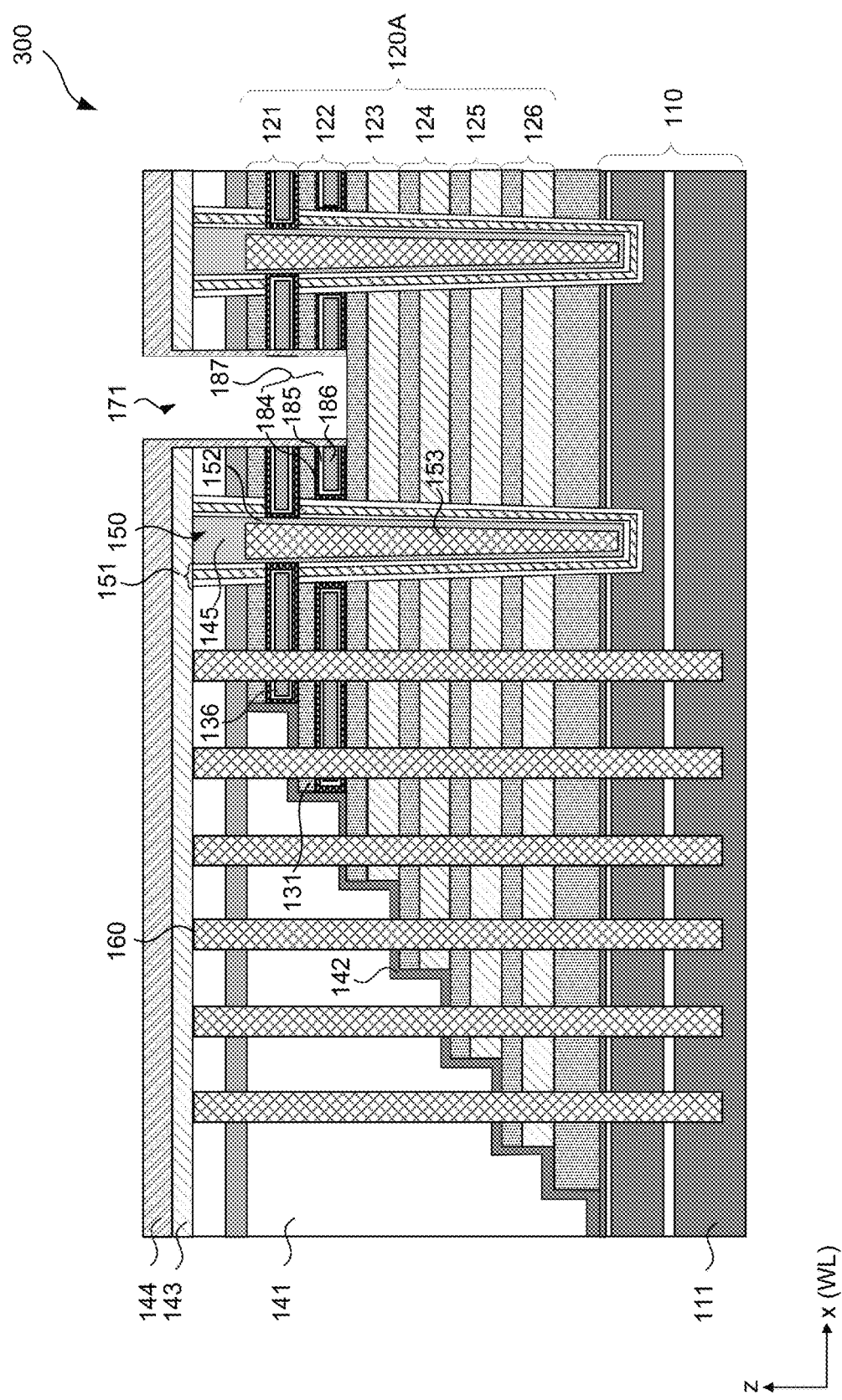

Referring to FIG. 2, at operation S260, a second control gate structure is formed in a second cavity, according to some embodiments. As shown in FIG. 3F, similar to first control gate structure 137, a second control gate structure 187 can include a dielectric layer 184, a first conductive layer 185, and a second conductive layer 186. In some embodiments, the aforementioned layers can respectively be similar to dielectric layer 134, first conductive layer 135, and second dielectric layer 136 of first control gate structure 137. Second control gate structure 187 can be formed by (i) extending opening 171 into level 122 until top surface of dielectric layer 131 and sidewalls of sacrificial layer 132 of level 122 are exposed; (ii) removing sacrificial layer 132 of level 122 using one or more etching processes to form a second cavity (not illustrated in FIG. 3F) between respective dielectric layers 131 of levels 121 and 122; and (iii) forming second control gate 187 in the second cavity. FIG. 3F illustrates opening 171 extending into level 122. Alternatively, the etching processes for extending opening 171 can extend into one or more additional levels of alternating layer stack 120A during operation S260, such as underlying levels 123 and 124.

Second control gate structure 187 can be different from first control gate structure 137 at least because function layers 151 can remain in the second cavity so that second control gate structure 187 directly contacts function layers 151 rather than channel layer 152. In other words, second control gate structure 187 is not in contact with channel layer 152. Therefore, function layer 151 at the intersection of second control gate structure 187 and channel layer 152 form one memory cell of level 122. Additionally, dielectric layer 185, first conductive layer 185, and second conductive layer 186 of second control gate structure 187 can respectively be different from dielectric layer 134, first conductive layer 135, and second dielectric layer 136 of first control gate structure 137, which can result in a different threshold voltage. For example, material compositions of the aforementioned layers that form second control gate 187 can be different from material compositions of the aforementioned layers that form first control gate structure 137. In some embodiments, the thicknesses of the aforementioned layers of first and second control gate structures 137 and 187 can be different. In some embodiments, the interface dipole moments of first and second control gate structures 137 and 187 can be different. After second control gate structure 187 is formed, additional masking material can be formed in sidewalls of opening 171 to protect second control gate structure 187 from subsequent fabrication processes. In some embodiments, the additional masking material can be formed similar to that of masking layer 144. As shown in FIG. 3F, masking layer 144 can extend from a top surface of capping layer 143 to a top surface of dielectric layer 131 of level 122. Portions of dielectric layer 131 of level 122 not protected by masking layer 144 is exposed to subsequent etching processes for extending opening 171 into level 123 and other underlying levels of alternating layer stack 120A.

Figure 3G:
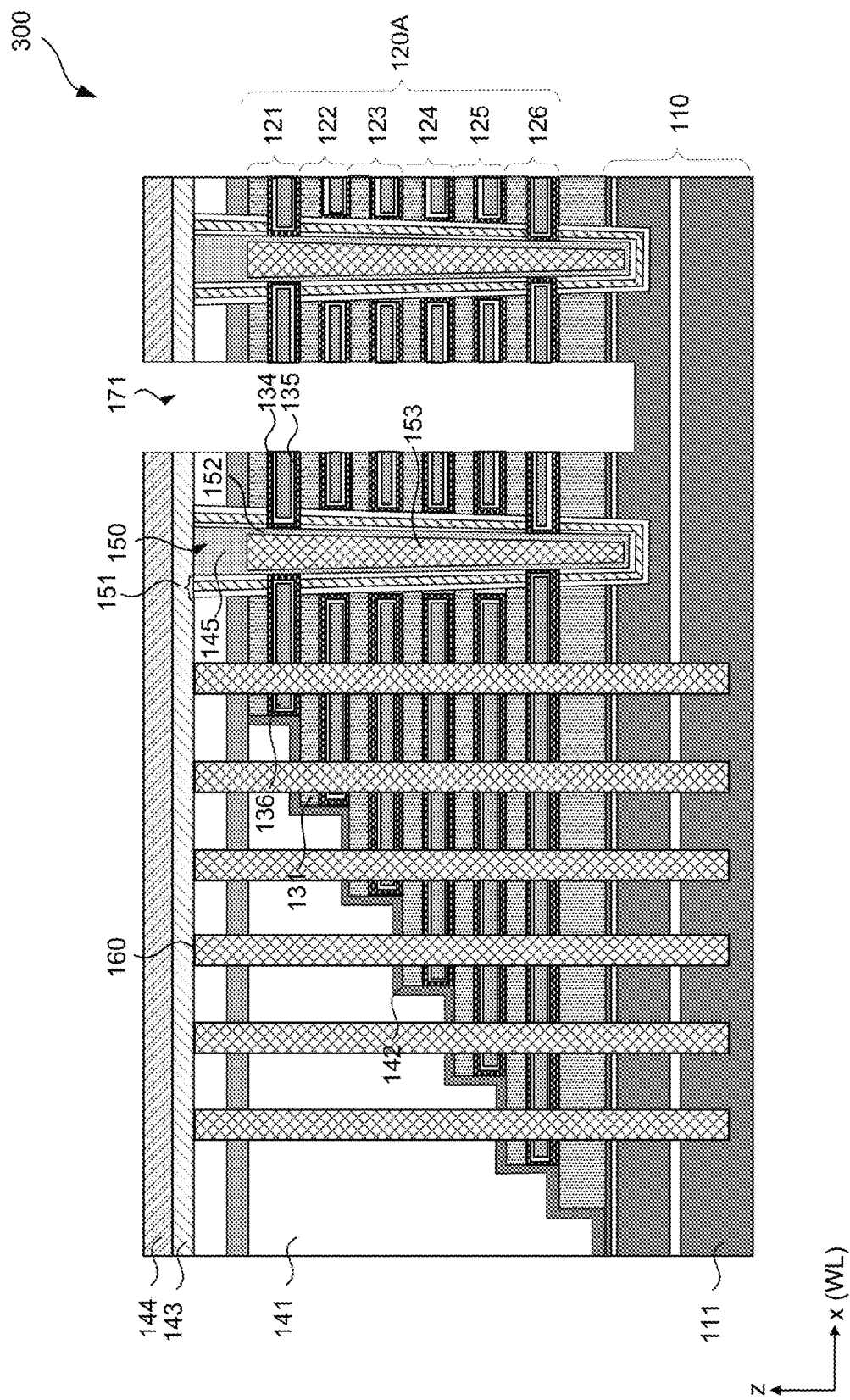

Referring to FIG. 2, at operation S270, additional control gate structures are formed, according to some embodiments. As shown in FIG. 3G, control gate structures are formed in levels 123-126 using methods similar to those for forming first and second control gate structures 137 and 187. For example, control gate structures 123-125 can be formed using similar methods for forming second control gate structure 187, where control gate structures directly contact function layer 151 and memory cells are formed between the control gate structures and channel layer 152. Control gate structures for each level can be formed by extending opening 171 through the dielectric layer of that level and replacing sacrificial layer 132 with a control gate structure. The control gate structure formed in the bottom-most level (e.g., level 126) can also be a bottom select gate structure similar to first control gate structure 137 described in FIG. 3E.

Due to fabrication condition differences, threshold voltages of memory cells within a channel structure (e.g., channel structure 150) can be different. Specifically, when control gate structures are formed using the same material and thicknesses, threshold voltages of memory cells for lower levels (levels closer to substrate 110) can be greater than threshold voltages of memory cells for upper levels (levels further away from substrate 110). As an example, threshold voltage for memory cell formed in level 125 can be greater than threshold voltage for memory cell formed in level 124 which can cause a reduction in device performance.

Forming control gate structures using methods described in FIGS. 3C-3G can provide memory cells of the same channel structure with substantially the same threshold voltages. The control gate structures can be formed using different materials or similar materials with different thicknesses such that threshold voltages of memory cells within the same channel structure (e.g., channel structure 150) are substantially the same. For example, material compositions of dielectric layers and conductive layers of control gate structures can be selected to adjust the work function of control gate structures which in turn can affect the threshold voltage. It should be noted that the above adjustment methods are provided as examples, and material compensation and layer thickness can both be adjusted to compensate for the increase in memory cells threshold voltages. For example, adjusting memory cell threshold voltage can be achieved by adjusting at least one of: (i) a thickness of dielectric layer 134; (ii) a material composition of dielectric layer 134; (iii) a thickness of first conductive layer 135; (iv) a material composition of first conductive layer 135; (v) a thickness of second conductive layer 136; (vi) a material composition of second conductive layer 136; and (vii) an interface dipole moment between dielectric layer 134 and first conductive layer 135.

As the number of staircase layers increase, fabrication condition variations can cause differences in critical dimensions of different portions of a channel structure (e.g., channel structure 150), which in turn can lead to deviations from threshold voltages for memory cells formed within the same channel structure. For example, threshold voltages of memory cells corresponding to the same channel structure may shift higher or lower, depending on the locations of the memory cells with respect to the channel structure. The deviations can cause errors in memory cell operation and reduce device yield. As an example, adjusting thicknesses of the dielectric layers and conductive layers of control gate structures can affect gate oxide capacitance (Cox) which in turn can be used to compensate the increase in memory cell threshold voltages. To increase gate oxide capacitance, dielectric layer 134 can be formed using a material with higher dielectric constant or with lower film thickness. As a further example, if first conductive layer 135 is formed using an aluminum titanium nitride compound, the aluminum and titanium ratio can be adjusted such that the electrical property of the compound more closely resembles that of aluminum, which in turn reduces the work function of the compound material. As a further example, reducing the thickness of dielectric layer 134 such that the electrical property of the control gate structure more closely resembles that of second conductive layer 136 (e.g., a conductive material formed using tungsten) can reduce the overall work function of the control gate structure. Alternatively, increasing the oxidization strength during the deposition process for forming dielectric layer 134 can reduce the effect of interface dipole moment on memory cell threshold voltages.

Figure 3H:
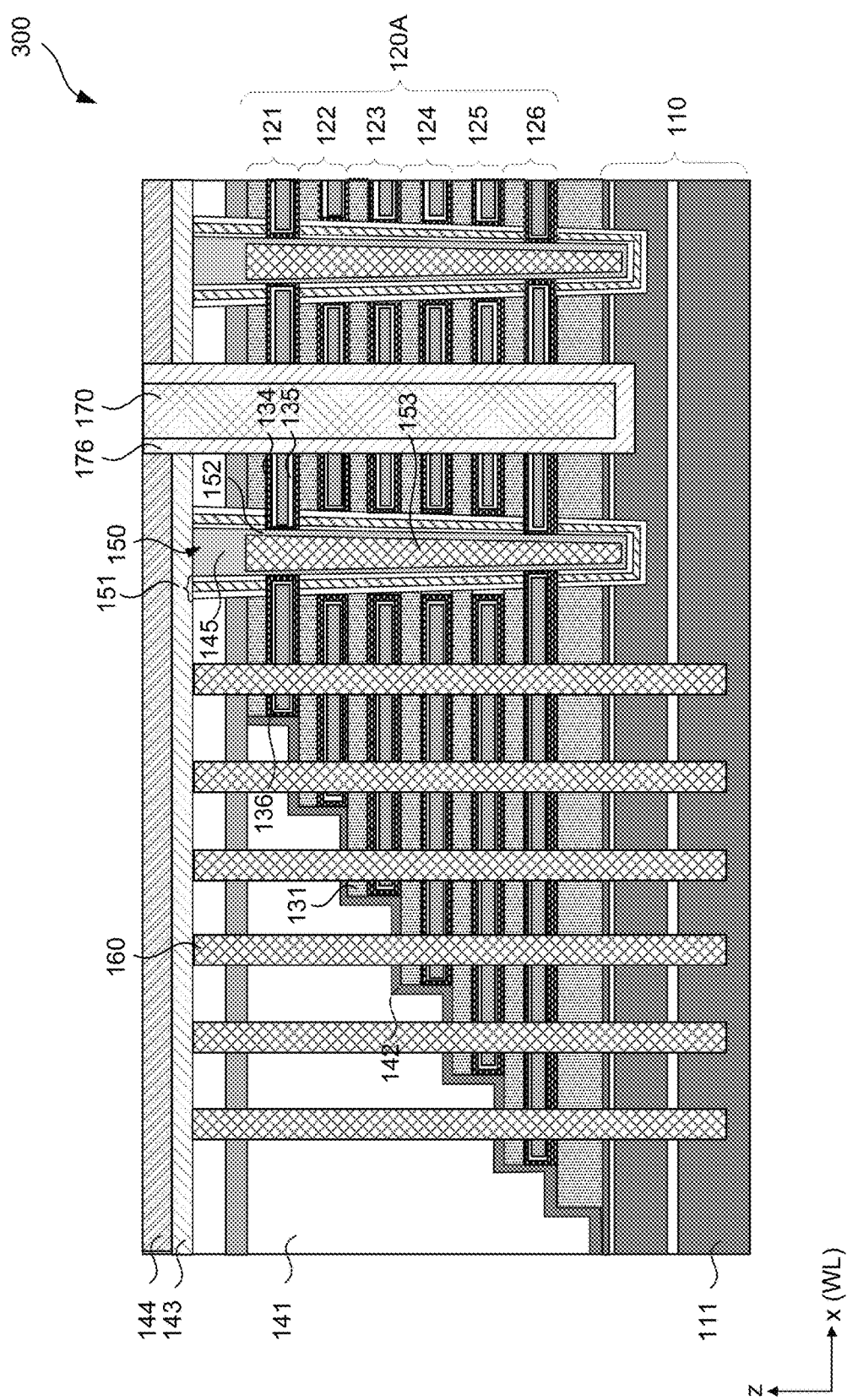

Referring to FIG. 2, at operation S280, gate line slit (GLS) structures are formed, according to some embodiments. As shown in FIG. 3H, a barrier layer 176 can be formed within opening 171 and on sidewall surfaces of control gate structures and dielectric layers 131. A conductive material is disposed on barrier layer 176 to form GLS structure 170. In some embodiments, barrier layer 176 and the conductive material of GLS structure 170 can be disposed using CVD, PVD, ALD, any suitable deposition methods, or combinations thereof.

Various embodiments in accordance with the present disclosure provide structures and fabricating methods for forming alternating control gate structures in 3D memory devices. For example, alternating layer stack of dielectric layers and sacrificial layers are formed on a substrate, followed by replacing the sacrificial layers with control gate structures in a top-down sequence. Specifically, the replacement process can begin from the upper sacrificial layers and continues to replace the underlying one or more sacrificial layers at a time. An opening can partially extend through the alternating layer stack of dielectric layers and sacrificial layers, exposing sidewalls of one or more sacrificial layers. Each exposed sacrificial layers can be replaced by a control gate structures. In some embodiments, the control gate structures formed in each replacement step can be different, allowing variations in control gate structures (e.g., layer material and/or layer thickness) such that the threshold voltages of memory cells throughout each channel structure are substantially the same. The replacement process can continue until all sacrificial layers are replaced.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
 disposing a layer stack on a substrate, wherein the layer stack includes a plurality of levels;
 forming a first control gate structure in a first level of the plurality of levels, wherein forming the first control gate structure further includes:
   forming a first opening through a dielectric layer of the first level and a sacrificial layer of the first level;
   removing a remaining portion of the sacrificial layer of the first level to form a first cavity;

disposing a first dielectric layer in the first cavity; and
disposing a first conductive layer in the first cavity; and
forming a second control gate structure in a second level below the first level, wherein forming the second control gate structure further includes:
extending the first opening into a dielectric layer of the second level and a sacrificial layer of the second level to form a second opening;
removing a remaining portion of the sacrificial layer of the second level to form a second cavity;
disposing a second dielectric layer in the second cavity, wherein the first dielectric layer and the second dielectric layer are different materials; and
disposing a second conductive layer in the second cavity.

2. The method of claim 1, wherein forming the first opening includes exposing a top surface of the dielectric layer of the second level.

3. The method of claim 1, wherein forming the first opening includes exposing a sidewall surface of the sacrificial layer of the first level.

4. The method of claim 1, wherein disposing the first and second conductive layers includes disposing first and second conductive materials, wherein material compositions and/or thicknesses of the first and second conductive materials are different.

5. The method of claim 1, further including disposing a third conductive layer on the first conductive layer and a fourth conductive layer on the second conductive layer.

6. The method of claim 5, wherein disposing the third and fourth conductive layers includes disposing third and fourth conductive materials, wherein material compositions and/or thicknesses of the third and fourth conductive materials are different.

7. The method of claim 1, wherein thicknesses of the first and second dielectric layers are different.

8. The method of claim 1, further including:
forming a channel hole through the layer stack;
disposing a function layer in the channel hole; and
disposing a channel layer in contact with the function layer.

9. The method of claim 8, wherein forming the first control gate structure further includes:
removing a portion of the function layer through the first cavity and exposing a portion of the channel layer; and
forming the first control gate structure in contact with the exposed portion of the channel layer.

10. The method of claim 8, wherein:
removing the remaining portion of the sacrificial layer of the second level includes exposing a sidewall portion of the function layer in the second cavity; and
forming the second control gate structure further includes disposing a dielectric material on the exposed sidewall portion of the function layer in the second cavity.

11. A method for forming a three-dimensional (3D) memory device, comprising:
disposing a layer stack on a substrate, wherein the layer stack includes a plurality of levels;
forming a channel structure, wherein forming the channel structure further includes:
forming a channel hole through the layer stack;
disposing a function layer in the channel hole; and
disposing a channel layer in contact with the function layer;
forming a first control gate structure in a first level of the plurality of levels, wherein forming the first control gate structure further includes:
forming a first opening through a dielectric layer of the first level and a sacrificial layer of the first level;
removing a remaining portion of the sacrificial layer of the first level;
removing a first portion of the function layer and exposing a portion of the channel layer; and
disposing a first dielectric material on the exposed portion of the channel layer; and
forming a second control gate structure in a second level below the first level, wherein forming the second control gate structure further includes:
extending the first opening into a dielectric layer of the second level and a sacrificial layer of the second level to form a second opening;
removing a remaining portion of the sacrificial layer of the second level and exposing a second portion of the function layer; and
disposing a second dielectric material on the exposed second portion of the function layer, wherein the first and second dielectric material are different dielectric materials.

12. The method of claim 11, further including disposing first and second conductive materials on the first and second dielectric materials, respectively, wherein material compositions and/or thicknesses of the first and second conductive materials are different.

13. The method of claim 12, further including disposing a third conductive material on the first conductive material and a fourth conductive material on the second conductive material.

14. The method of claim 11, wherein forming the first and second openings include exposing sidewalls of the sacrificial layer of the first and second levels, respectively.

15. The method of claim 11, further including etching the layer stack to form a staircase structure.

16. The method of claim 11, wherein forming the first opening includes exposing a top surface of the dielectric layer of the second level.

17. A three-dimensional (3D) memory device, comprising:
a layer stack disposed on a substrate, wherein the layer stack includes a plurality of levels;
a first control gate structure disposed in a first level of the plurality of levels, including:
a first dielectric layer; and
a first conductive layer in contact with the first dielectric layer; and
a second control gate structure disposed in a second level, including:
a second dielectric layer, wherein dielectric constants of the first and second dielectric layers are different; and
a second conductive layer in contact with the second dielectric layer, wherein material compositions and/or thicknesses of at least portions of the first and second conductive layers are different.

18. The 3D memory device of claim 17, further including a channel structure extending through the layer stack, wherein the channel structure includes a channel layer at least partially surrounded by a function layer.

19. The 3D memory device of claim 18, wherein the first control gate structure extends through the function layer and is in contact with the channel layer.

20. The 3D memory device of claim 18, wherein the second control gate structure is in contact with a sidewall of the function layer.

* * * * *